(12) United States Patent
Wilhelm

(10) Patent No.: US 7,645,666 B2
(45) Date of Patent: Jan. 12, 2010

(54) METHOD OF MAKING A SEMICONDUCTOR DEVICE

(75) Inventor: Detlef Wilhelm, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 60 days.

(21) Appl. No.: 11/781,320

(22) Filed: Jul. 23, 2007

(65) Prior Publication Data
US 2009/0029517 A1   Jan. 29, 2009

(51) Int. Cl.
*H01L 21/8249* (2006.01)
(52) U.S. Cl. ............... 438/235; 438/311; 438/680; 438/712; 257/E21.17; 257/E21.127; 257/E21.32; 257/E21.218; 257/E21.227; 257/E21.245; 257/E21.278; 257/E21.311; 257/E21.312; 257/E21.371
(58) Field of Classification Search ........... 438/235, 438/236, 311, 294, 510, 663, 723, 733, 743, 438/745, 706, 712, 756, 931
See application file for complete search history.

(56) References Cited

U.S. PATENT DOCUMENTS

| | | | | |
|---|---|---|---|---|
| 5,202,284 A | * | 4/1993 | Kamins et al. | 117/95 |
| 6,706,583 B1 | * | 3/2004 | Comard | 438/235 |
| 6,777,302 B1 | * | 8/2004 | Chen et al. | 438/335 |
| 6,780,695 B1 | * | 8/2004 | Chen et al. | 438/202 |
| 6,965,133 B2 | * | 11/2005 | Geiss et al. | 257/197 |
| 7,390,721 B2 | * | 6/2008 | Geiss et al. | 438/312 |

* cited by examiner

*Primary Examiner*—David Nhu
(74) *Attorney, Agent, or Firm*—Philip Schlazer; Patent Department

(57) ABSTRACT

One or more embodiments relate to a method of making a heterojunction bipolar transistor (HBT) structure. The method includes: forming a partially completed heterojunction bipolar transistor (HBT) structure where the partially completed heterojunction bipolar transistor (HBT) structure includes a silicon layer having an exposed surface and a nitride layer having an exposed surface. The method includes growing a first oxide on the silicon layer and etching the nitride layer using an etchant.

19 Claims, 11 Drawing Sheets

METHOD OF MAKING A SEMICONDUCTOR DEVICE

FIELD OF THE INVENTION

Generally, the present invention relates to semiconductor devices and methods of making semiconductor devices. More particularly, the present invention relates to methods for etching a semiconductor device.

BACKGROUND OF THE INVENTION

By way of general background, in bipolar transistors two types of current carriers, electrons and "holes," are involved in the conduction mechanism of the device. A bipolar integrated circuit typically comprises many interconnected bipolar transistors, each of which may be a three-terminal device having a base region, a collector region and an emitter region. The collector and emitter regions of a transistor may be doped with impurities that are of the same conductivity type, for example n-type or p-type, and the base region may be of the opposite conductivity type. The transistor is then to be of the n-p-n or the p-n-p type.

Growth in both high-frequency wired and wireless markets has introduced new opportunities where semiconductors such as SiGe have unique advantages over bulk complementary metal oxide semiconductor technology. Because of the characteristics of the bipolar transistor, and because of the signal processed by the transistor in the radio frequency circuit is a signal having high frequency, the bipolar transistor, especially the SiGe heterojunction bipolar transistor is frequently employed in the radio frequency circuit.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
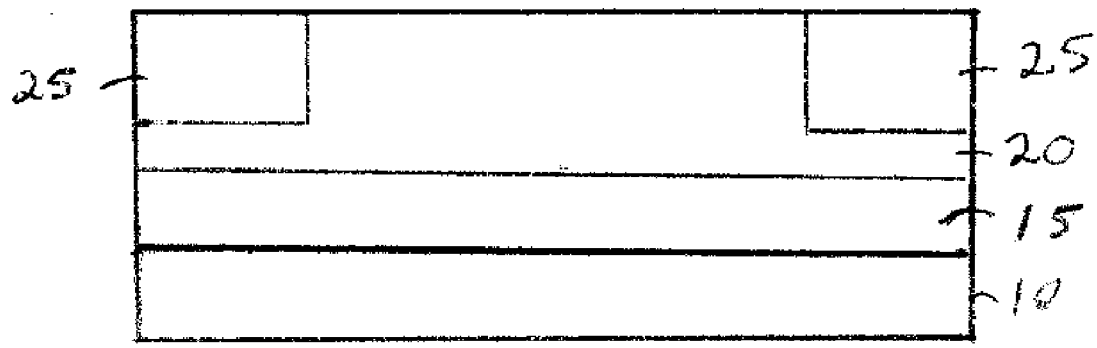
FIG. 1 shows an embodiment of a partially completed transistor structure of the present invention.

FIG. 1 shows an embodiment of a partially completed semiconductor device of the present invention. FIG. 1 shows a substrate 10. In one or more embodiments of the invention, the substrate 10 may be a p-type substrate. However, more generally, in one or more embodiments of the invention, the substrate may be a silicon substrate or other suitable substrate. The substrate may be a silicon-on-insulator (SOI) substrate. The SOI substrate may, for example, be formed by a SIMOX process. The substrate may be a silicon-on-sapphire (SOS) substrate.

A collector region 20 is formed within the substrate 10. In one or more embodiments of the invention, the collector region 20 is formed of a lightly doped (for example, an n-doped) n-type material. Isolation regions 25 are defined in the substrate. In the embodiment shown, the isolation regions 25 are shown as trenches etched into the substrate 10 that have been filled with an insulating material, such as $SiO_2$ or other suitable insulating material, to insulate one transistor cell from adjacent transistor cells. In the embodiment shown, the isolation regions 25 are formed using a shallow trench isolation (STI) process. However, in other embodiments, isolation regions may be formed otherwise, such as by a LOCOS process. Additionally, deep trench isolation regions (not shown in FIG. 1) may also be formed in the substrate. In addition, the substrate may further include a buried channel layer 15. In the embodiment shown in FIG. 1, the buried channel layer may be formed as a more heavily doped n+ doped layer within the substrate 10 and disposed below the collector region 20.

Figure 2:
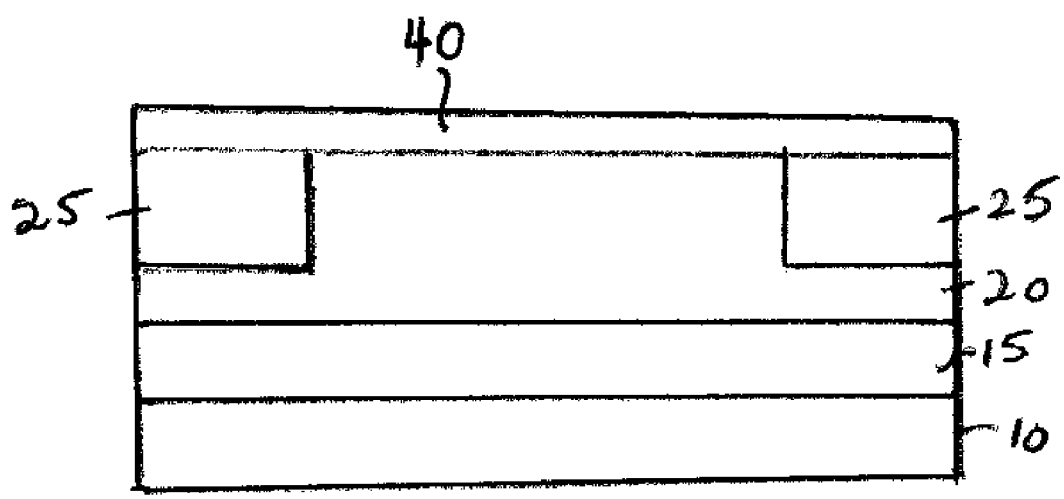
FIG. 2 shows an the formation of an oxide layer in accordance with an embodiment of the invention.

Referring to FIG. 2, after the formation of the isolation regions 25, an oxide layer 40 is formed over the substrate as well as over the isolation regions 25. In the embodiment shown, the oxide layer 40 is formed over the n-doped collector region 20 as well as over the isolation regions 25. The oxide layer 40 may be a deposited oxide such as a CVD oxide.

The oxide may, for example, be a TEOS oxide. The oxide layer may also be formed by a growth process such as silicon dioxide ($SiO_2$). The thickness of the oxide layer 40 is not limited to any particular thickness. In an embodiment of the invention, the oxide layer 40 may have a thickness of about 10 nm to about 100 nm. In another embodiment of the invention, the thickness may be around 10 nm to about 50 nm. As an example, the thickness may be about 40 nm.

Figure 3:
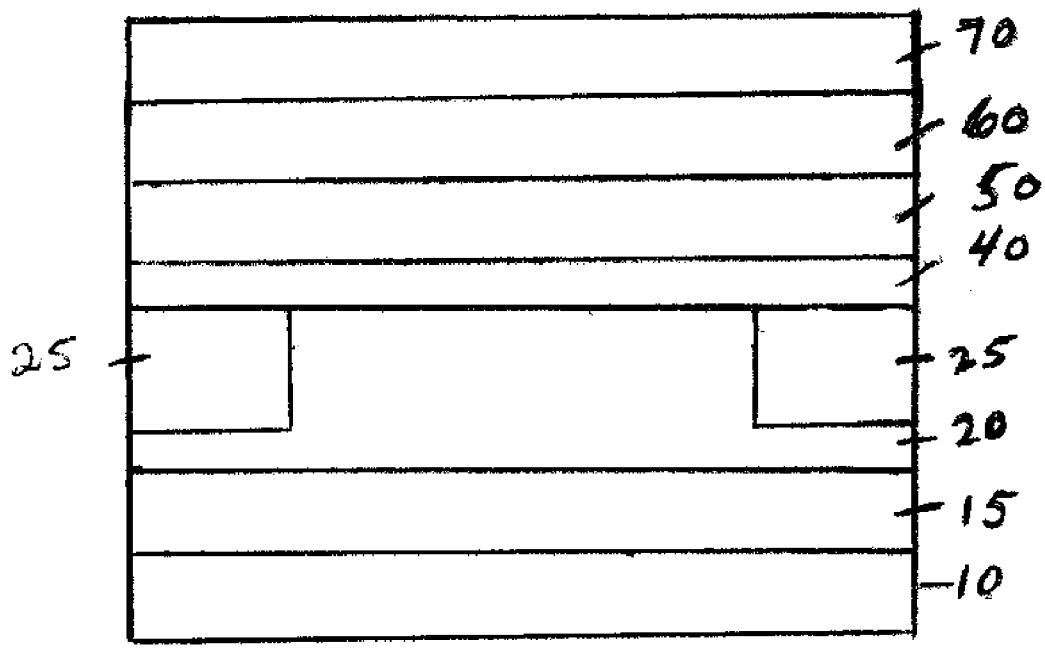
FIG. 3 shows the formation of polysilicon, oxide and nitride layers in accordance with an embodiment of the invention.

Referring to FIG. 3, a p+ polysilicon layer 50 is formed over the oxide layer 40. The p+ polysilicon layer 50 may be formed by first depositing a layer of polysilicon which is then doped with a p-type dopant so as to form a p+ doped layer. An oxide layer 60 is formed over the p+ polysilicon layer 50. The oxide layer 60 may be formed of a CVD oxide such as a TEOS oxide. In one or more embodiments of the invention, other types of oxides may also be used. A nitride layer 70 is formed over the oxide layer 60. The nitride layer 70 may be formed of a silicon nitride or any other type of nitride.

Figure 4:
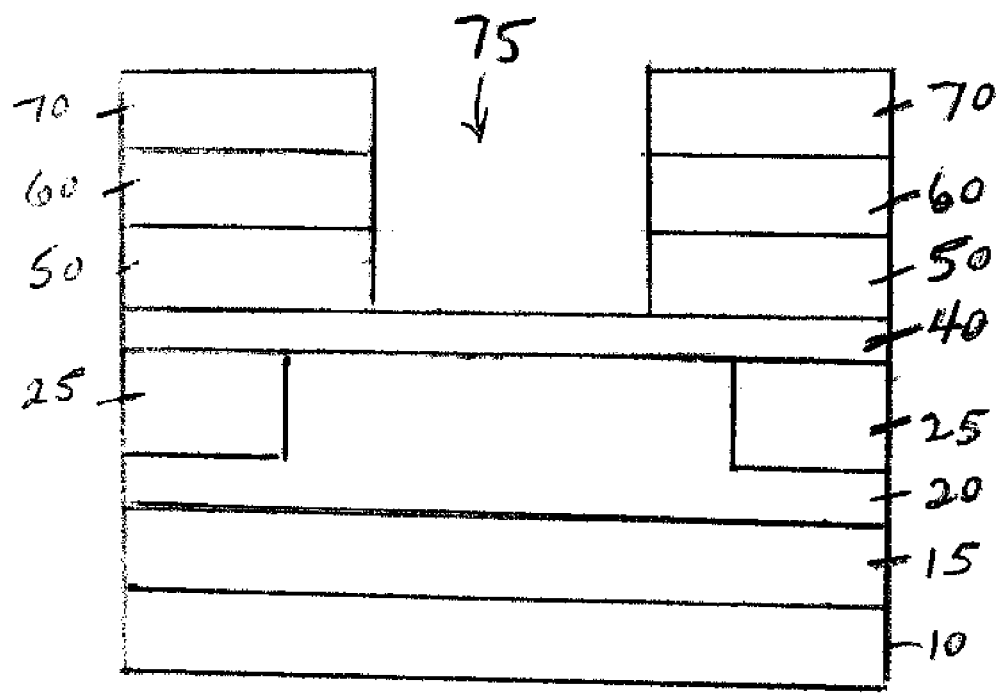
FIG. 4 shows the formation of an opening through the polysilicon, oxide and nitride layers shown in FIG. 3 in accordance with an embodiment of the invention.

Referring to FIG. 4, the stack of layers comprising the p+ polysilicon layer 50, the oxide layer 60 and the nitride layer 70 are then etched and an opening 75 is formed in these layers so as to expose the oxide layer 40. The opening 75 may be formed using a reactive ion etch (RIE). The opening 75 is also referred to herein as the emitter window.

Figure 5:
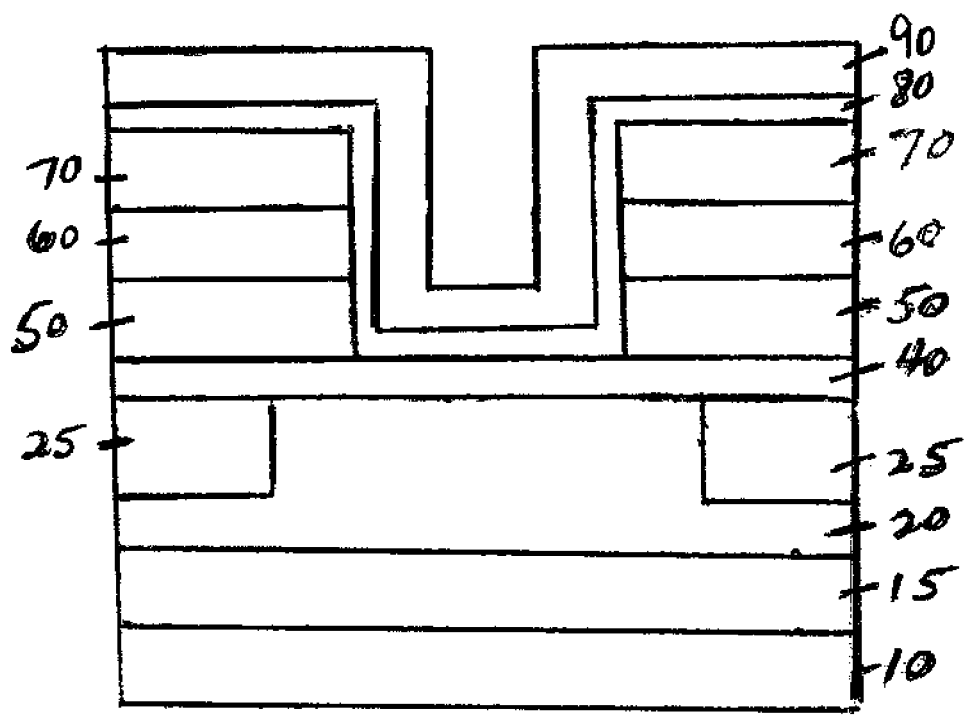
FIG. 5 shows the formation of nitride and polysilicon layers over the structure shown in FIG. 4 in accordance with an embodiment of the invention.

Referring to FIG. 5, a nitride layer 80 is conformally deposited onto the bottom and sidewall surfaces of the opening 75 (shown in FIG. 4) as well as over the top surface of the nitride layer 70. The nitride layer 80 may be formed of a silicon nitride or any other type of nitride. A polysilicon layer 90 is then conformally deposited over the nitride layer 80.

Figure 6:
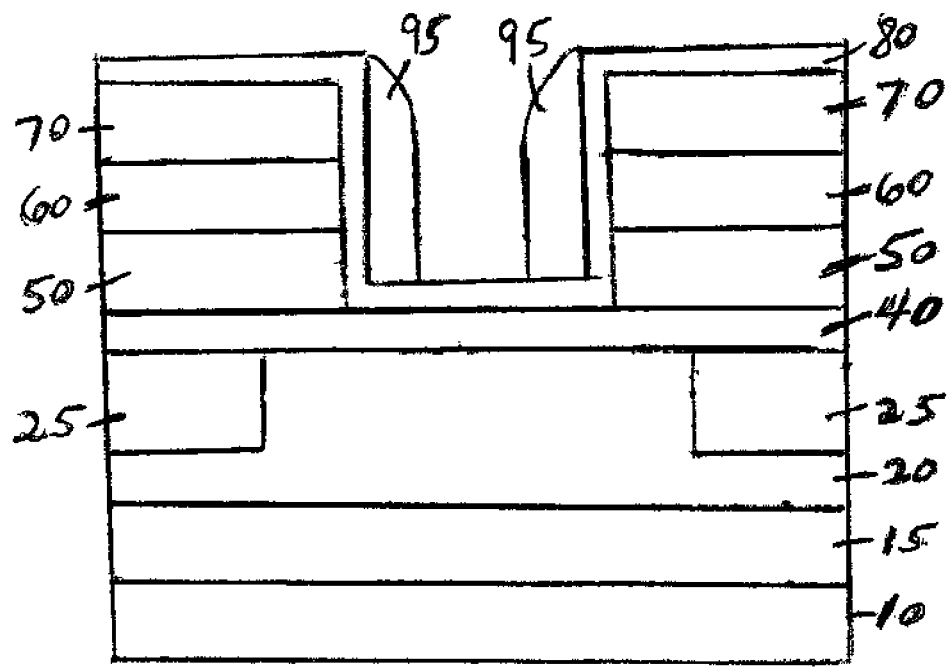
FIG. 6 shows the formation of polysilicon spacers in accordance with an embodiment of the invention.
Figure 7:
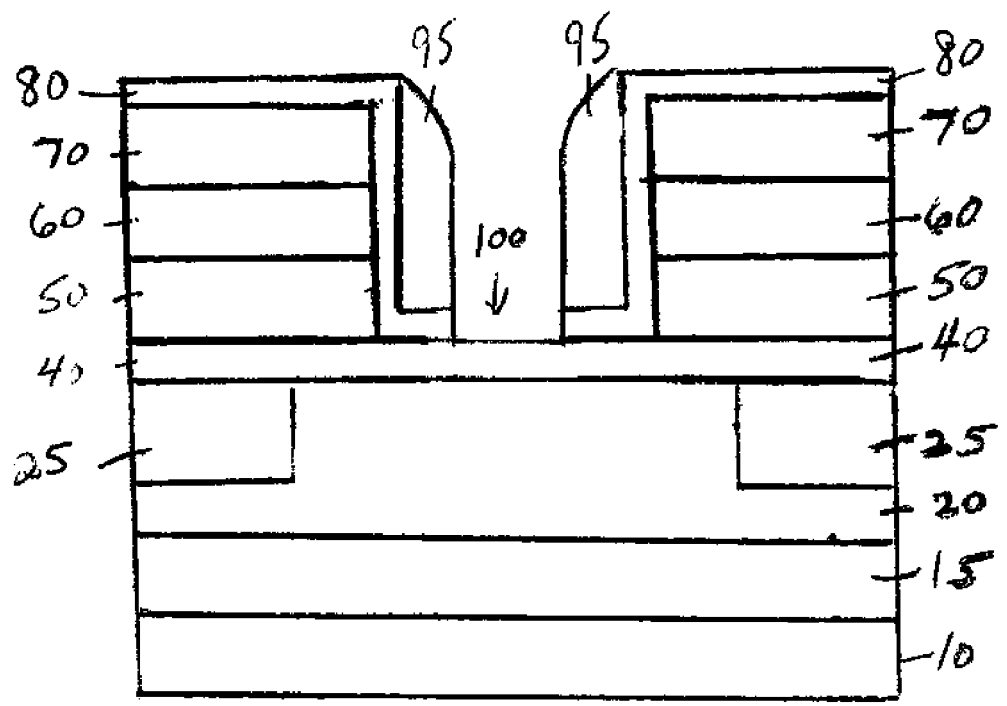
FIG. 7 shows the formation of an opening in an oxide layer from the structure of FIG. 6 in accordance with an embodiment of the invention.

Referring to FIG. 6, the polysilicon layer 90 is then anisotropically etched to form polysilicon spacers 95. Referring to FIG. 7, the polysilicon spacers 95 serve as a mask so that an opening 100 may be formed which etches completely through the nitride layer 80 but stops on the oxide layer 40. The opening 100 (e.g. the etch through the nitride layer 80 as shown in FIG. 7) may be formed using a reactive ion etching process (RIE). It is possible that, in one or more embodiments, the opening 100 may be made to stop within the oxide layer 40. It is also possible that, in one or more embodiments, the opening 100 may be made to etch through the oxide layer 40 and stop on the collector region 20.

Figure 8:
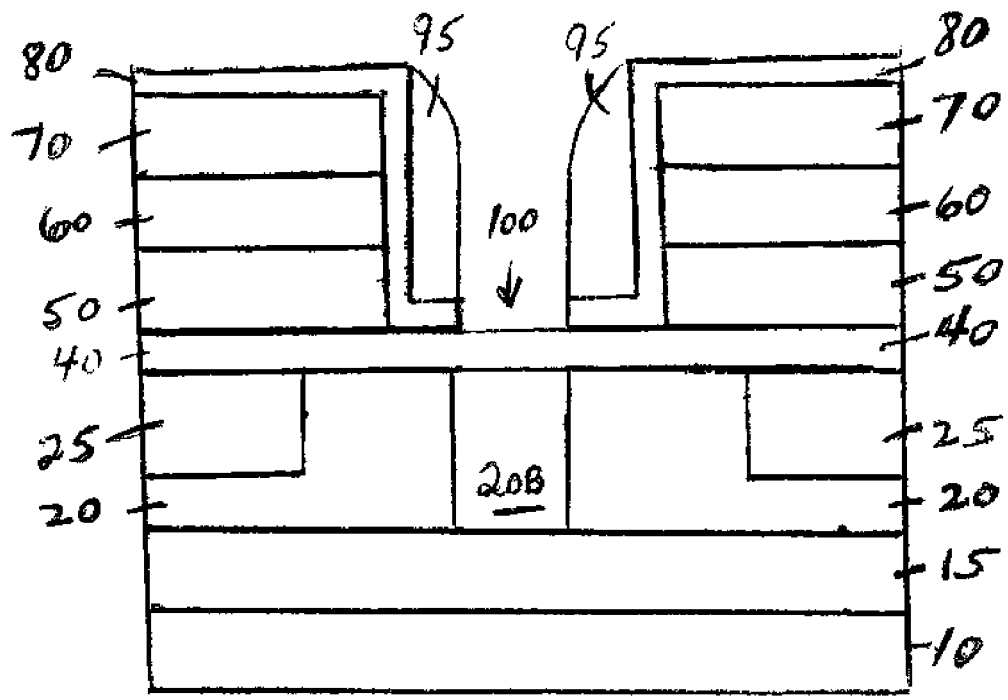
FIG. 8 shows the formation of a collector implant in accordance with an embodiment of the invention.

Referring to FIG. 8, after the opening 100 is formed by etching through the nitride layer 80, a collector implant process is performed wherein the structure within the emitter window may be doped using an n-type dopant such as phosphorous. As a result of this n-type doping process, a central portion 20B of the collector layer 20 underlying the opening 100 becomes a more heavily doped n-type region relative to the remaining portion of the collector layer 20 outside of the central portion 20B. In one or more embodiments, the remaining portion of the collector layer 20 outside of the central portion 20B remains as a more lightly doped n-portion.

Figure 9:
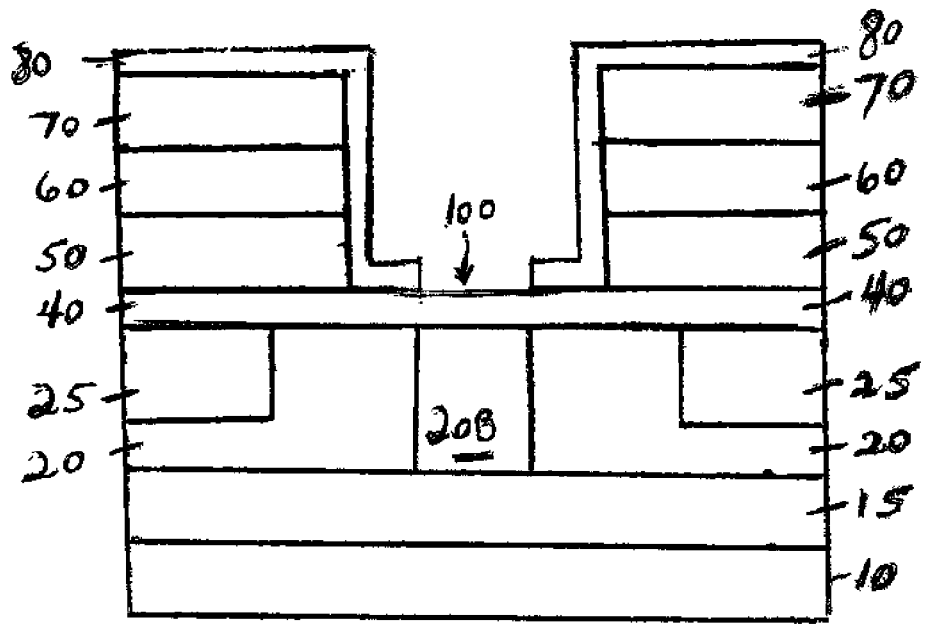
FIG. 9 shows the removal of polysilicon spacers in accordance with an embodiment of the invention.

Referring to FIG. 9, after the collector implant process is completed, the polysilicon spacers 95 are removed. This may be performed using a wet etch process.

Figure 10:
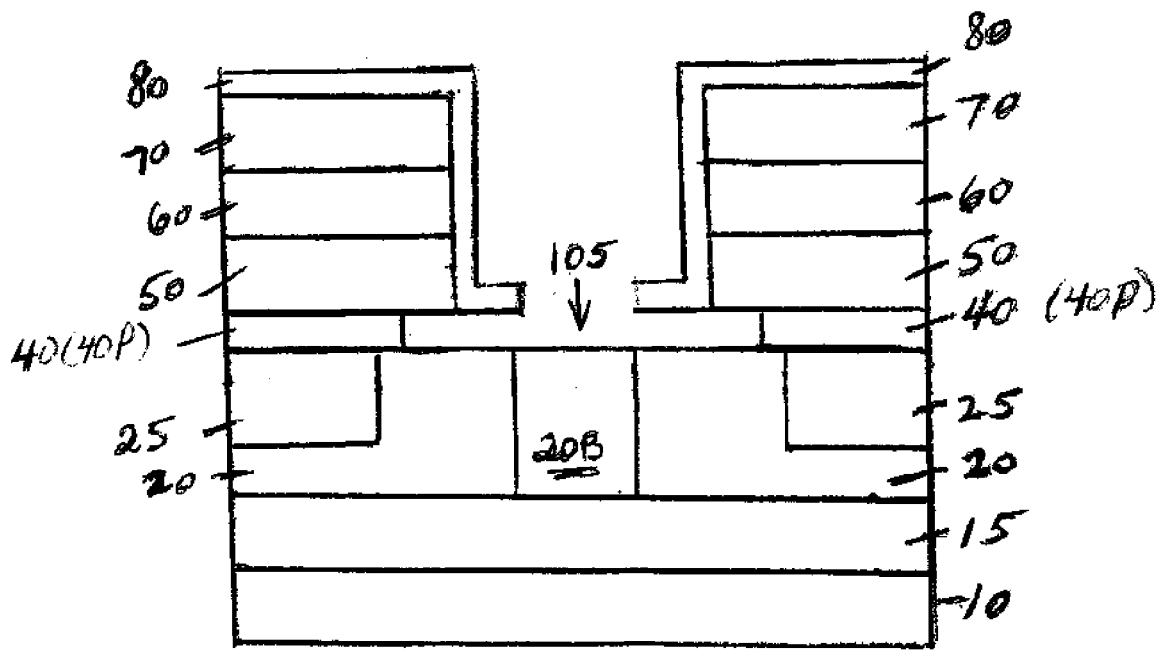
FIG. 10 shows the result of etching an oxide layer in the structure of FIG. 9 in accordance with an embodiment of the invention.

Referring to FIG. 10, the oxide layer 40 is then etched to remove at least a portion of the oxide layer 40. In one or more embodiments, an isotropic etch may be used. In one or more embodiment, the etch may be a wet etch such as an HF etch. In one or more embodiments of the invention, the etching is performed so as to remove a central portion of the oxide layer 40. In one or more embodiments, the etching leaves an outer portion 40P of the oxide layer 40. The etching process may be viewed as creating an opening 105 though the oxide layer 40. In one or more embodiments, the opening 105 may be in the form of a hole. The hole may have any shape. For example, the hole may be square, rectangular or round. In one or more embodiments, it may be possible that the opening may be in the form of a trench. The opening 105 has one or more sidewalls.

In the embodiment shown in FIG. 10, the sidewall(s) of the opening 105 (corresponding to the sidewall(s) of oxide layer 40P) are shown as essentially vertical. However, in one or more other embodiments of the invention, the sidewalls of the opening 105 may be sloped.

In one or more embodiments of the invention, the etching process removes a central portion of the oxide layer 40 but leaves an outer portion 40P which overlies the collector layer 20. In the embodiment shown, the remaining outer portion 40P of the oxide layer 40 makes direct contact with the collector layer 20. In addition, in the embodiment of the invention shown, the etching process is sufficient to create an undercut below the nitride layer 80 so as to expose a bottom surface of the nitride layer 80. In the embodiment shown, the etching process is also sufficient to create an undercut below the p+ polysilicon layer 50 so as to expose at least a portion of the bottom surface of the polysilicon layer 50.

Figure 11:
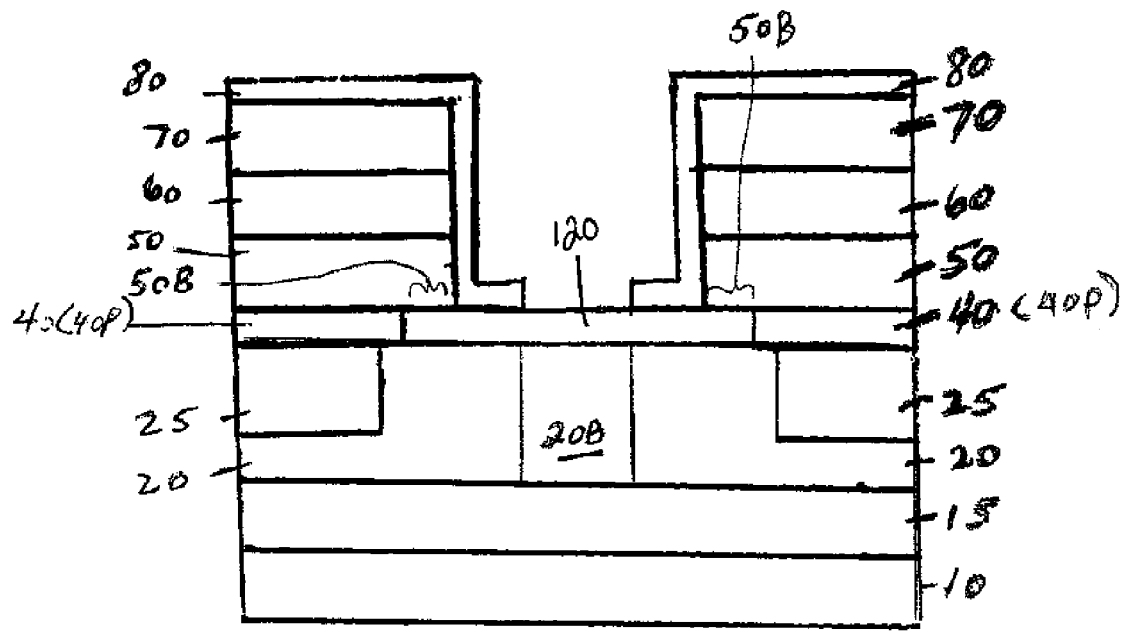
FIG. 11 shows the formation of a base layer in accordance with an embodiment of the invention.

FIG. 11 shows the formation of a base layer 120. In one or more embodiments of the invention the base layer 120 is a SiGe base layer. The SiGe base layer may be formed by selective epitaxy. Referring to the embodiment shown in FIG. 11, starting from a top surface of the collector 20 (including a top surface of the more heavily doped portion 20B of collector 20) there is an epitaxial growth of a SiGe monocrystalline portion. Likewise, starting from the bottom, overhanging surface 50B of the p+ polysilicon layer 50, there is an epitaxial growth of a SiGe polycrystalline portion. No growth of the SiGe base layer takes places on the surfaces of the oxide or nitride layers. The monocrystalline and polycrystalline SiGe portions grow together and make contact so there is a conductive pathway between the p+ polysilicon layer 50 and the collector layer 20. As noted above, the collector layer 20 includes the more heavily doped portion 20B. In one or more embodiments of the invention, the base layer 120 is a SiGe base layer. In one or more embodiments, the SiGe base layer may comprise a polycrystalline portion and a monocrystalline portion. The SiGe base layer may be doped with a p-type dopant such as boron. The SiGe base layer may be p+ type doped. The p+ polysilicon layer 50 serves as a base electrode for the transistor.

Figure 12:
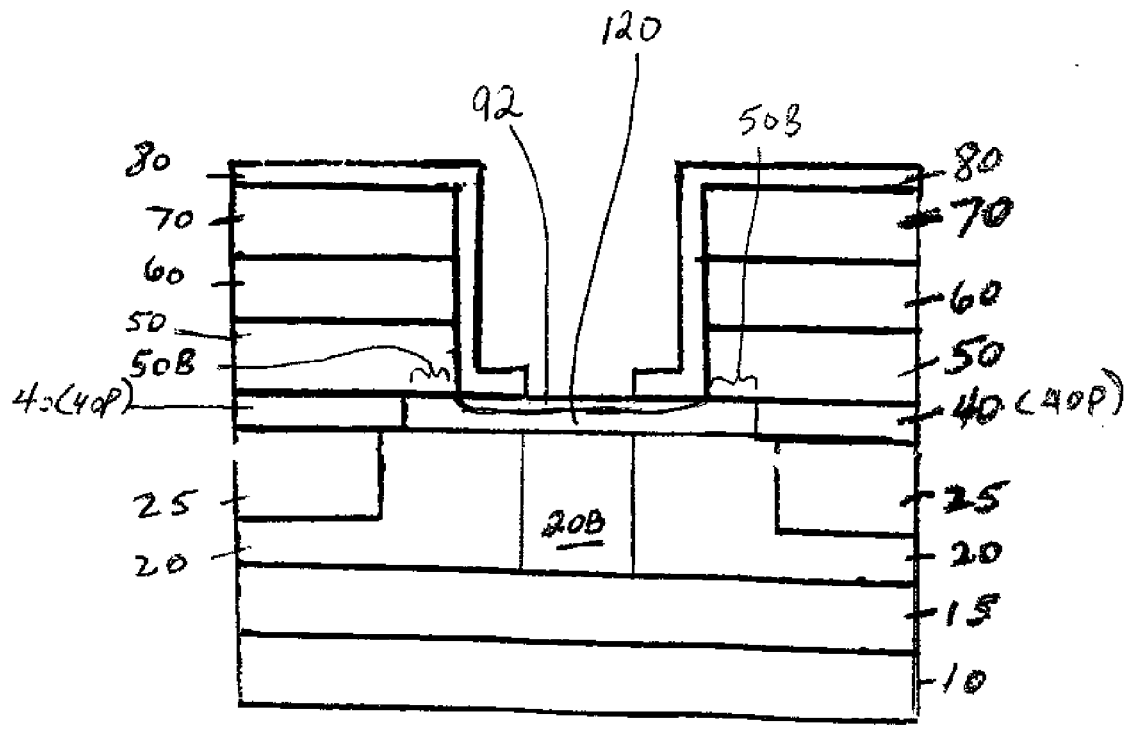
FIG. 12 shows the formation of a cap layer in accordance with an embodiment of the invention.

Referring to FIG. 12, in one or more embodiments of the invention, the formation of the base layer 120 is followed by the formation of a cap layer 92 on top of the base layer 120. In one or more embodiments of the invention, the cap layer 92 is a silicon cap layer. Hence, in one or more embodiments, a silicon cap layer overlies a SiGe base layer. The silicon cap layer may comprise a silicon material. In one or more embodiments, the silicon material may be a polycrystalline silicon material. In one or more embodiments, the silicon material may be a monocrystalline silicon material. In one or more embodiments, the silicon material may be an amorphous silicon material.

Figure 13:
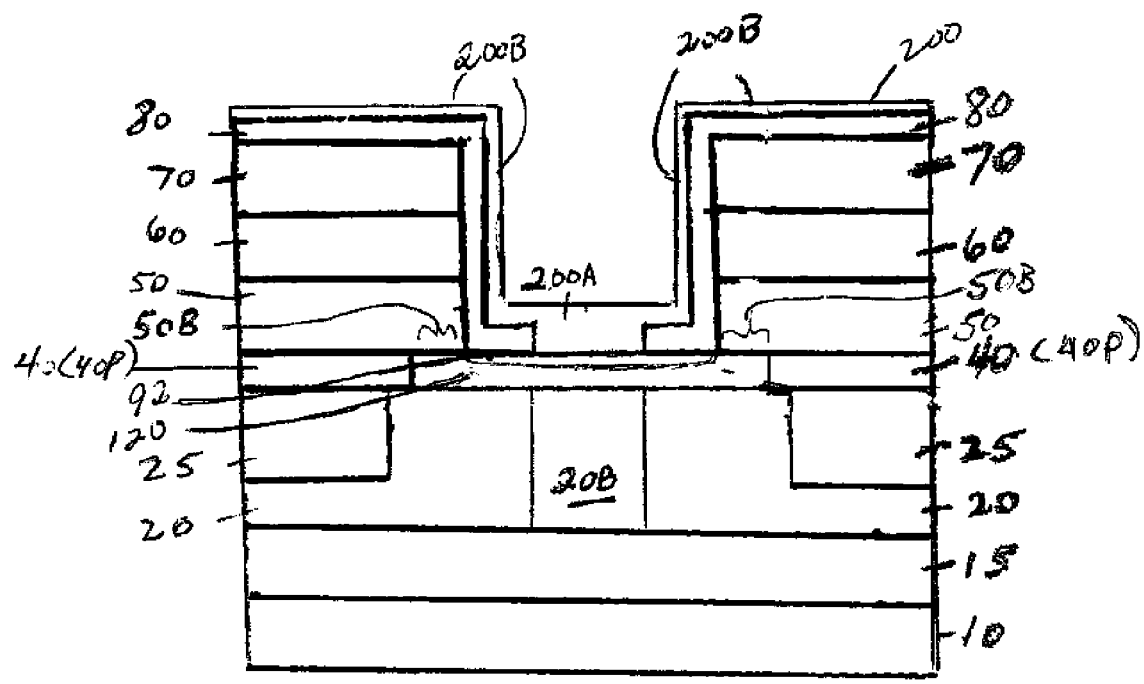
FIG. 13 shows the formation of an oxide over the silicon cap layer and an oxide over the nitride layer in accordance with an embodiment of the invention.

Referring to FIG. 13, after the formation of the silicon cap layer 92, an oxide is formed on the silicon of the silicon cap layer 92. Also, an oxide may be formed on the nitride layer 80. FIG. 13 shows the formation of an oxide layer 200 on both the silicon cap layer 92 and the nitride layer 80. The oxide layer may be formed in many different ways. In one or more embodiments, the oxide layer may be formed by a controlled growth process. In one or more embodiments, the oxide layer may be formed by a controlled thermal oxidation process. Hence, in one or more embodiments, oxides may be formed on the silicon cap layer 92 and the nitride layer 80 using a controlled oxidation process such as a controlled thermal oxidation growth process. The oxidation process may be a wet oxidation process or a dry oxidation process. The oxidizing agent may be any oxidizing agent.

In an embodiment of the invention, oxides may be grown on the silicon and the nitride layers using a dry oxidation process. For example, the oxides may be grown by exposing the silicon and the nitride layers to an oxygen plasma (e.g. an $O_2$ plasma). In one embodiment, the silicon and nitrogen layers may be exposed to the oxygen plasma for more than about 30 seconds. In another embodiment, the layers may be exposed to the oxygen plasma for more than about 40 seconds. In another embodiment, the layers may be exposed to the oxygen plasma for more than about 50 seconds. In another embodiment, the layers may be exposed to the oxygen plasma for more than about 60 seconds. In another embodiment, the layers may be exposed to the oxygen plasma for about 70 seconds or more. In another embodiment, the layers may be exposed to the oxygen plasma for less than about 90 seconds. In another embodiment, the layers may be exposed to the plasma for less than about 80 seconds.

As a result of exposure to the oxygen plasma, a first oxide grows on the surface of the silicon and a second oxide grows on the surface of the nitride. The oxide that grows on the silicon surface may be an $SiO_2$. The oxidizing agent (e.g., the oxygen plasma) causes a first oxide portion 200A to grow on the silicon. Also, the oxidizing agent may additional cause a second oxide portion 200B to grow on the nitride. In one or more embodiments, it is possible that the amount of oxide growth on the nitride may be very small or negligible or none at all. Hence, in one or more embodiments, it is possible that an oxide is formed on the silicon layer but that no oxide (or a negligible amount of oxide) is formed on the nitride layer).

The oxide layer 200 that is formed on both the silicon layer 92 and the nitride layer 80 may thus include two portions. It may include a first oxide portion 200A formed on the silicon layer 92 and a second oxide portion 200B formed on the nitride layer 80. The oxidation rate of the silicon may be greater than the oxidation rate of the nitride. Hence, the growth rate of the oxide on the silicon may be greater than the growth rate of the oxide on the nitride. The thickness of first oxide portion 200A formed on the silicon layer may thus be greater than the thickness of the second oxide portion 200B formed on the nitride layer.

It is noted that the rate of oxide growth describes how fast the oxide grows. It may depend upon one or more parameters such as, for example, the composition of the material upon which the oxide is growing, crystal orientation of this material, and/or the doping levels of this material. The rate may also depend upon, one or more parameters such as, for example, the temperature, pressure, and/or oxidizing condition (e.g. wet or dry).

It is noted that in one or more other embodiments of the invention, it is possible that an oxide is formed on the silicon cap layer and/or the nitride layer by a deposition process.

After the formation of the oxide layer 200, the nitride layer 80 may be removed. This may be done by an etch process. Generally, any type of etch process may be used. In one embodiment, the etch process may be a wet chemical etch. Hence, a chemical etchant may be applied to the structure shown in FIG. 13. An example of an enchant which may be used is phosphoric acid. The phosphoric acid may be applied to the structure shown in FIG. 13. In one embodiment, the phosphoric acid may be applied at a temperature greater than about 110° C. In another embodiment, the phosphoric acid may be applied at a temperature greater than about 125° C. In another embodiment, the phosphoric acid may be applied at a temperature greater than about 145° C. In another embodiment, the phosphoric acid may be applied at a temperature greater than 150° C. In one or more embodiments, the temperature of the phosphoric acid may less than about 175° C. In one example, the temperature of the phosphoric acid may be about 155° C.

In one embodiment, the phosphoric acid may be applied for greater than about 10 minutes. In another embodiment, the phosphoric acid may be applied for greater than about 20 minutes. In another embodiment, the phosphoric acid may be applied for greater than about 30 minutes. In another embodiment, the phosphoric acid may be applied for about 40 minutes or more. In one embodiment, the phosphoric acid may be applied for less than about 60 minutes. In one embodiment, the phosphoric acid may be applied for less than about 50 minutes.

The phosphoric acid must first etch away the oxides on the silicon and nitride layers before it can reach either the nitride layer 80 or the silicon layer 92. Since the first oxide portion 200A on the silicon may thicker than the second oxide portion 200B on the nitride, the silicon layer 92 may be protected for a longer period of time from the phosphoric acid attack than the nitride layer 80. (In one or more embodiments, it is assumed that the etch rates of both oxides portions 200A and 200B are about the same relative to the etchant). In one or more embodiments, the phosphoric acid reaches the nitride layer 80 while the silicon cap layer 92 is still protected by the oxide. Thus, the removal of the nitride layer 80 may be well under way before the silicon cap layer 92 is even reached by the phosphoric acid.

In addition, the etch rate of the phosphoric acid on the silicon material itself may be slower than the etch rate on the nitride material.

Hence, the etching attack of the phosphoric acid on the silicon can be delayed by the protective oxide layer. The thicker oxide on the silicon than on the nitride results in the silicon cap layer being protected against the attack by the phosphoric acid for a longer period of time. As a result of using the protective oxide, the nitride layers 80, 70 may be removed from the structure while reducing or essentially eliminating the amount of the silicon cap layer also removed during the same etching process. In one or more embodiments, it may be possible to remove all of the nitride material without removing essentially any of the silicon material. This may be useful, since the amount of silicon removed from the silicon cap layer may influence the RF-performances of the heterojunction bipolar transistors such as SiGe heterojunction bipolar transistors. The same technique is applicable to other semiconductor devices as well and is not limited to the manufacture of heterojunction bipolar transistors.

Likewise, in one or more embodiments, the technique may be applicable to other materials in addition to silicon materials and nitride materials. In one or more embodiments, the technique may be useful for any two materials where an oxide grows faster on one material than on the other material. In one or more embodiments, a first material may comprise the element Si while a second material may comprise the element N. In one or more embodiments, a first material may comprise a silicon material while a second material may comprise a nitride material.

Figure 14:
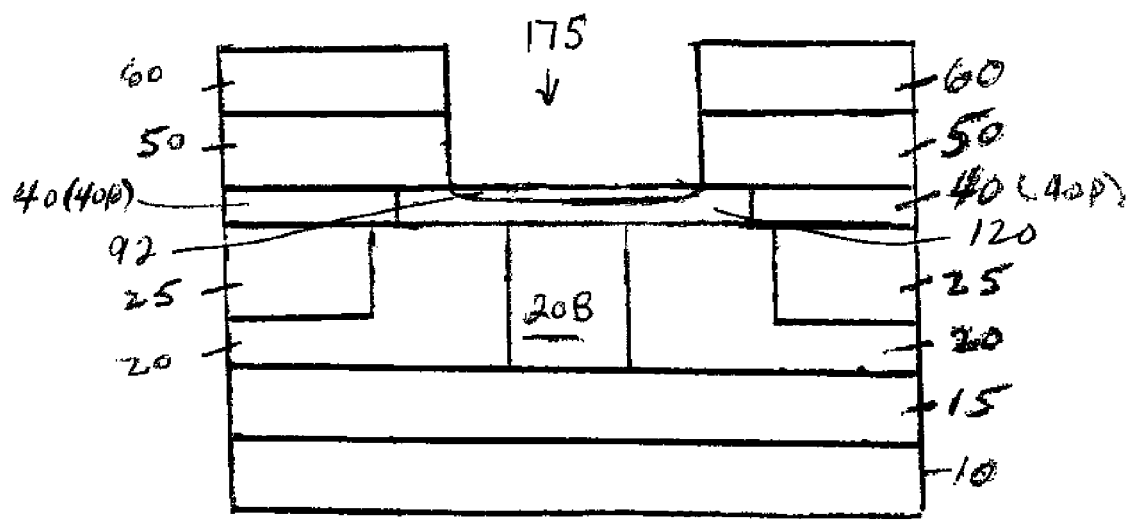
FIG. 14 shows the removal of nitride layers in accordance with an embodiment of the invention.

FIG. 14 shows the removal of the nitride layer 80 as well as the removal of the nitride layer 70 by wet etching. The removal of the nitride layers 80 and 70 form the opening 175. The sidewall surfaces of layers 50, 60 formed the sidewall surface(s) of the opening 175. The top surface of the silicon cap 92 forms the bottom surface of the opening 175.

Figure 15:
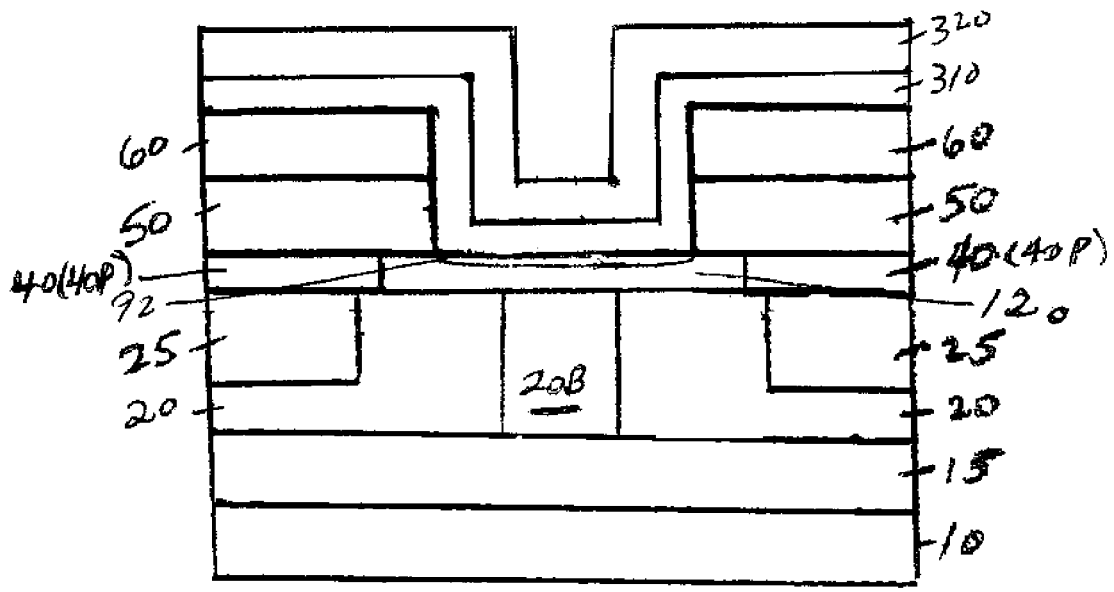
FIG. 15 shows the formation of an oxide layer and a nitride layer in accordance with an embodiment of the invention.

FIG. 15 shows the formation of an oxide layer 310 over the top surface of layer 60 as well as over the sidewall and bottom surfaces of the opening 175. The oxide layer 310 may be deposited as a CVD oxide such as a TEOS oxide. The deposition of oxide layer 310 may be a substantially conformal deposition. In an embodiment, the thickness of oxide layer 310 may between about 30 nm and 70 nm. In an embodiment, the thickness of oxide layer 310 may be about 50 nm.

After the formation of oxide layer 310, a nitride layer 320 may be formed over oxide layer 310. The nitride layer 320 may have a thickness between about 60 nm and about 100 nm. In an embodiment, the thickness of nitride layer 320 may be about 80 nm. The deposition of nitride layer 320 may be a substantially conformal deposition.

Figure 16:
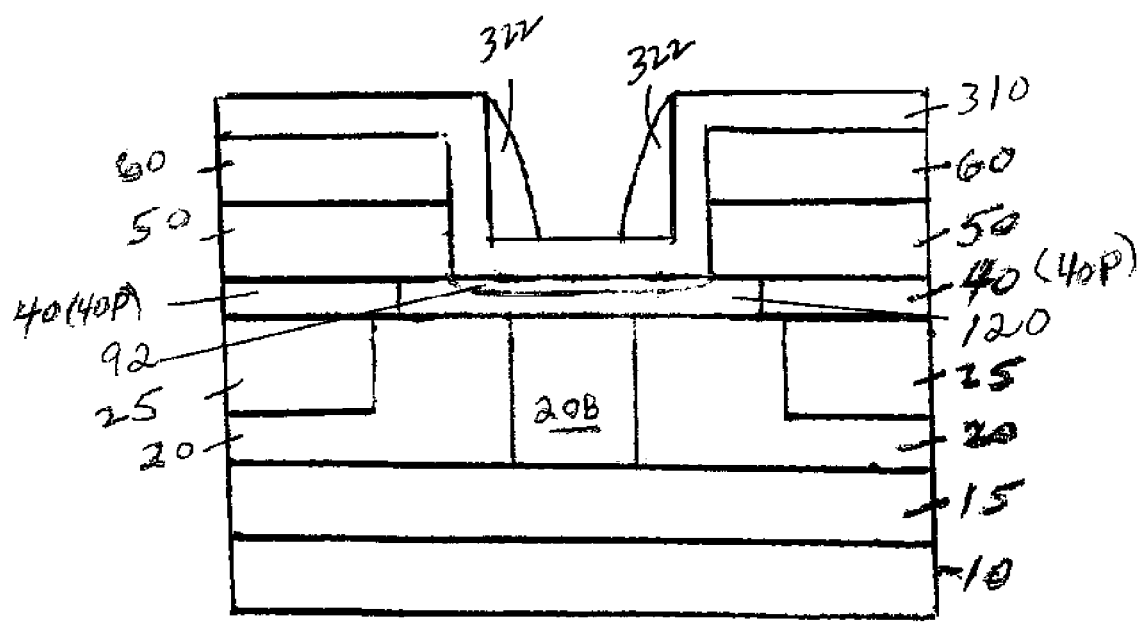
FIG. 16 shows the formation of nitride spaces in accordance with an embodiment of the invention.

Referring to FIG. 16, a spacer etch is then performed to create the nitride spacers 322. The spacer etch may be an anisotropic etch of the nitride layer 310.

Figure 17:
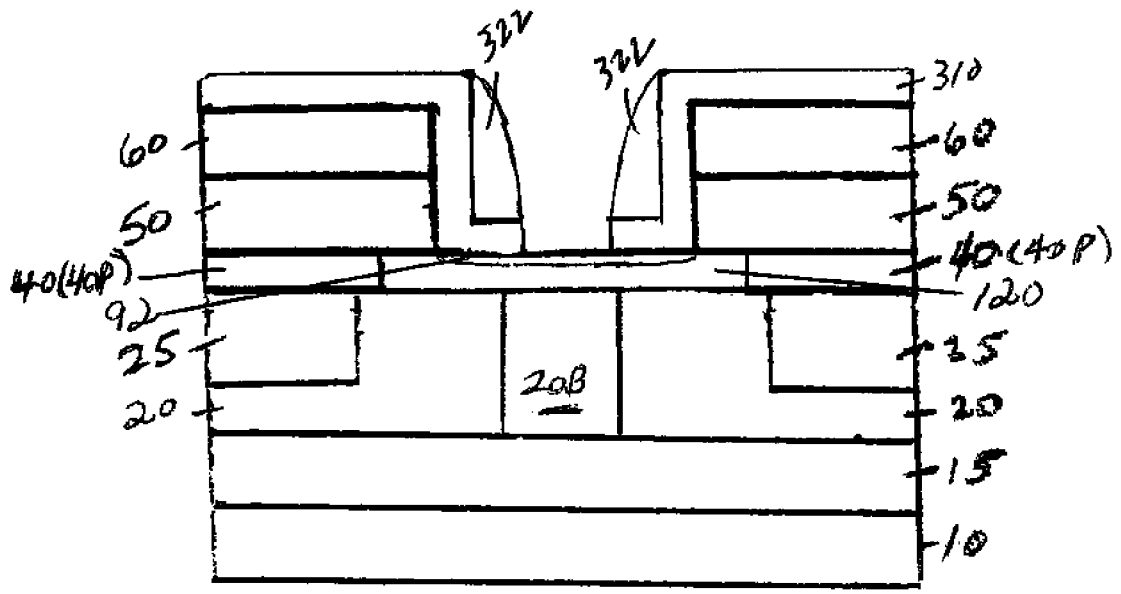
FIG. 17 shows the etch of an oxide layer in accordance with an embodiment of the invention.

Referring to FIG. 17, the nitride spacers may then be used as a mask for etching through the oxide layer 310. The etch may be performed by a wet etch process. In one or more embodiments, the etch through the oxide layer 310 exposes a top surface of the silicon cap layer 92. In one or more embodiments, the etch through the oxide layer 310 stops at the top surface of the silicon cap layer 92.

Figure 18:
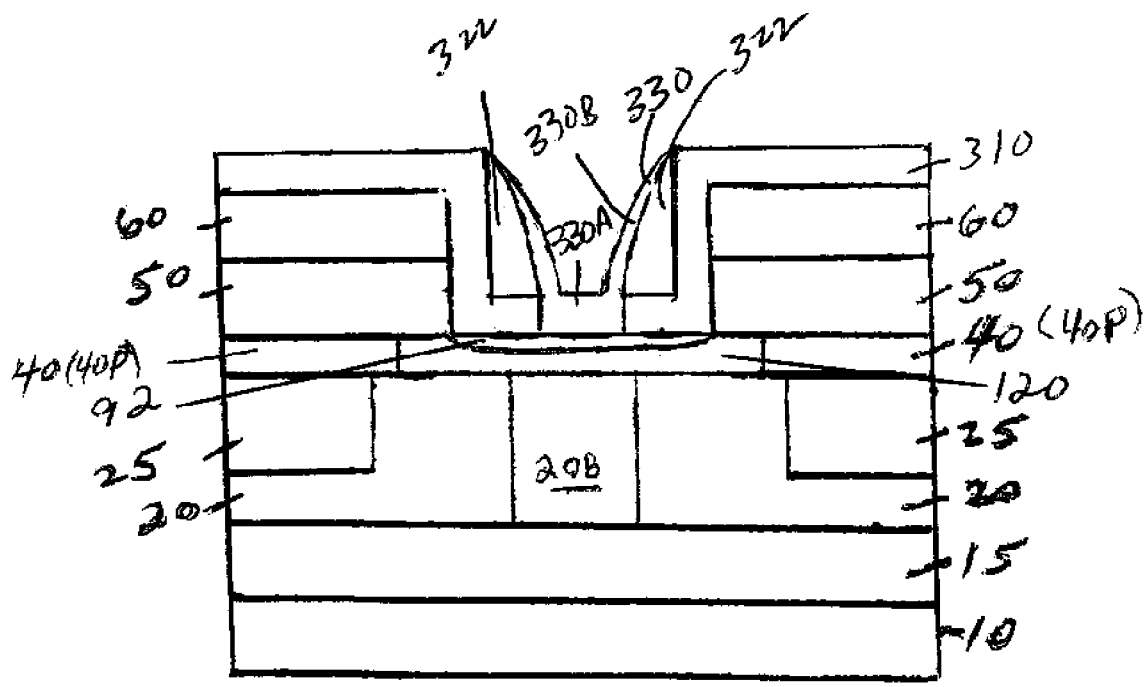
FIG. 18 shows the formation of an oxide over the silicon cap layer and an oxide over nitride spacers in accordance with an embodiment of the invention.

Referring to FIG. 18, an oxide layer 330 is next formed on an exposed surface of the silicon cap layer 92 as well as on exposed surfaces of the nitride spacers 322. In one or more embodiments, the oxide 330 may be formed by a growth process. In one or more embodiments, the oxide 330 may be formed by a thermal oxidation process. FIG. 18 shows the formation of an oxide layer 330 on both the silicon cap layer 92 and the nitride spacers 322. In one or more embodiments, the surfaces of the silicon cap layer 92 and the nitride spacers 322 may be oxidized using a controlled oxidation process such as a controlled thermal oxidation process. The oxidation process may be a wet oxidation process or a dry oxidation process. The oxidizing agent may be any oxidizing agent. The oxidation agent used may be an oxygen plasma (e.g. an $O_2$ plasma).

As a result of exposure to the oxygen plasma, a first oxide grows on the surface of the silicon and a second oxide grows on the surface of the nitride. The oxide that grows on the silicon surface may be an $SiO_2$. The oxidizing agent (e.g., the oxygen plasma) causes a first oxide portion 330A to grow on the silicon. Also, the oxidizing agent may additional cause a second oxide portion 330B to grow on the nitride. In one or more embodiments, it is possible that the amount of oxide growth on the nitride may be very small or negligible or none at all. Hence, in one or more embodiments, it is possible that an oxide is formed on the silicon layer but that no oxide (or a negligible amount of oxide) is formed on the nitride layer).

The oxide layer 330 that is formed on both the silicon layer 92 and the nitride spacers 322 may thus include two portions. It may include a first oxide portion 330A formed on the silicon layer 92 and a second oxide portion 330B formed on the nitride spacers 322. The oxidation rate of the silicon may be greater than the oxidation rate of the nitride. Hence, the growth rate of the oxide on the silicon may be greater than the growth rate of the oxide on the nitride spacers 322. The thickness of first oxide portion 330A formed on the silicon layer may thus be greater than the thickness of the second oxide portion 330B formed on the nitride spacers 322.

It is noted that in one or more other embodiments of the invention, it is possible that an oxide is formed on the silicon cap layer 92 and/or the nitride spacers 322 by a deposition process.

After the formation of the oxide layer 330, the nitride spacers 330 may be removed. This may be done by an etch process. Generally, any type of etch process may be used. In one embodiment, the etch process may be a wet chemical etch. Hence, a chemical etchant may be applied to the structure shown in FIG. 18. An example of an enchant which may be used is phosphoric acid. The phosphoric acid may be applied to the structure shown in FIG. 18. The temperature and time conditions of the phosphoric acid etch may be the same as those described above.

The phosphoric acid must first etch away the oxides on the silicon and nitride spacers before it can reach either the silicon layer 92 or the nitride spacers 322. Since the first oxide portion 330A on the silicon is thicker than the second oxide portion 330B on the nitride, the silicon layer 92 is protected for a longer period of time from the phosphoric acid attack than is the nitride spacers 322. In one or more embodiments, the phosphoric acid reaches the nitride spacers 322 while the silicon cap layer 92 is still protected by the oxide. Thus, the removal of the nitride spacers 322 may be well under way before the silicon cap layer 92 is even reached by the phosphoric acid.

In addition, the etch rate of the phosphoric acid on the silicon layer itself may be slower than the etch rate on the nitride spacers themselves.

Hence, the etching attack of the phosphoric acid on the silicon can be delayed by the protective oxide layer. The thicker oxide on the silicon than on the nitride results in the silicon cap layer being protected against the attack by the phosphoric acid for a longer period of time. As a result of using the protective oxide, the nitride spacers 322 may be removed from the structure while reducing or essentially eliminating the amount of the silicon cap layer also removed during the same etching process.

Figure 19:
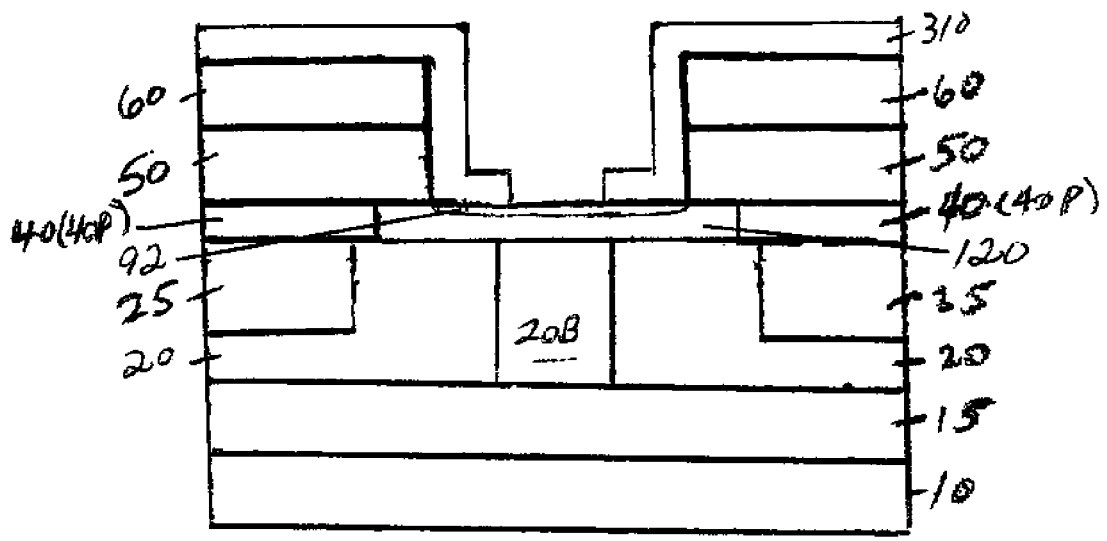
FIG. 19 shows the removal of nitride spacers in accordance with an embodiment of the invention.
Figure 20:
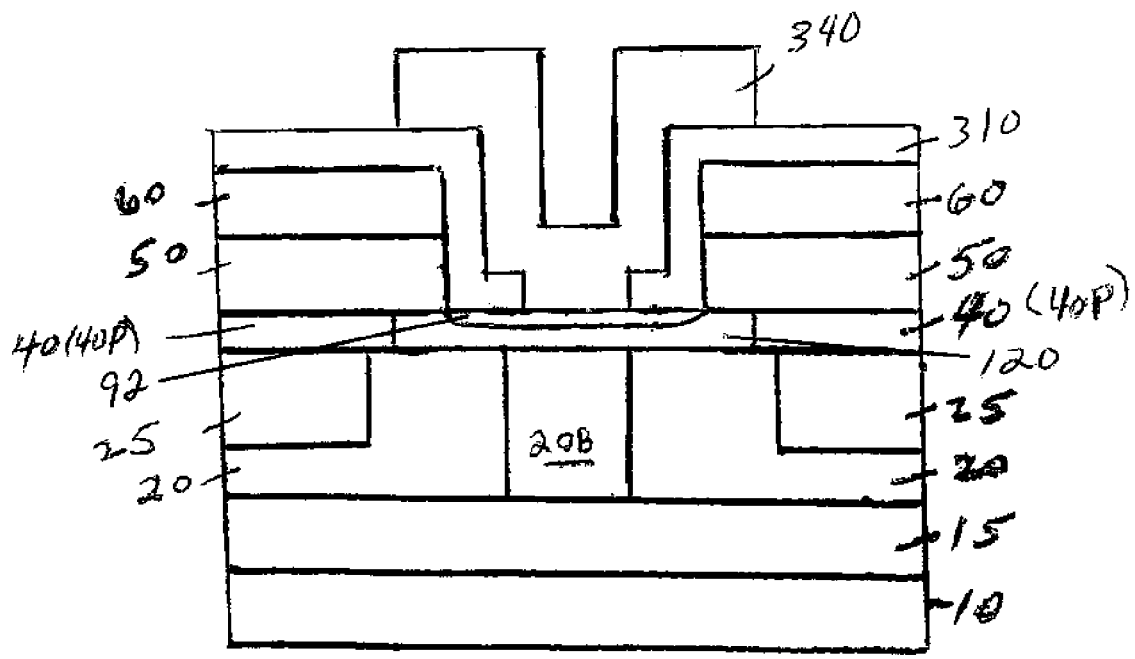
FIG. 20 shows the formation of an emitter layer.

FIG. 19 shows the result of removing the nitride spacers 322 from the structure shown in FIG. 18. Referring to FIG. 20, FIG. 20 shows the formation of the emitter layer 340. The emitter layer 340 may be formed as a heavily n+ doped layer. The emitter layer 340 may be formed from a heavily arsenic-doped material. The emitter layer 340 may be formed so as to grow monocrystalline on the silicon cap layer 92 and amorphous on the surrounding oxide layers 310. After patterning the emitter layer 340, a rapid thermal annealing (RTA) step may be performed, which diffuses the emitter layer a certain distance (for example, about 15 nm to about 30 nm) deep into the underlying silicon cap layer 92 of the base. During the emitter drive-in, the amorphous parts of the emitter layer 340 may become polycrystalline. After the emitter drive-in, processing continues by salicidation of the one or more base electrodes and by forming the copper metallization (not shown).

Figure 21:
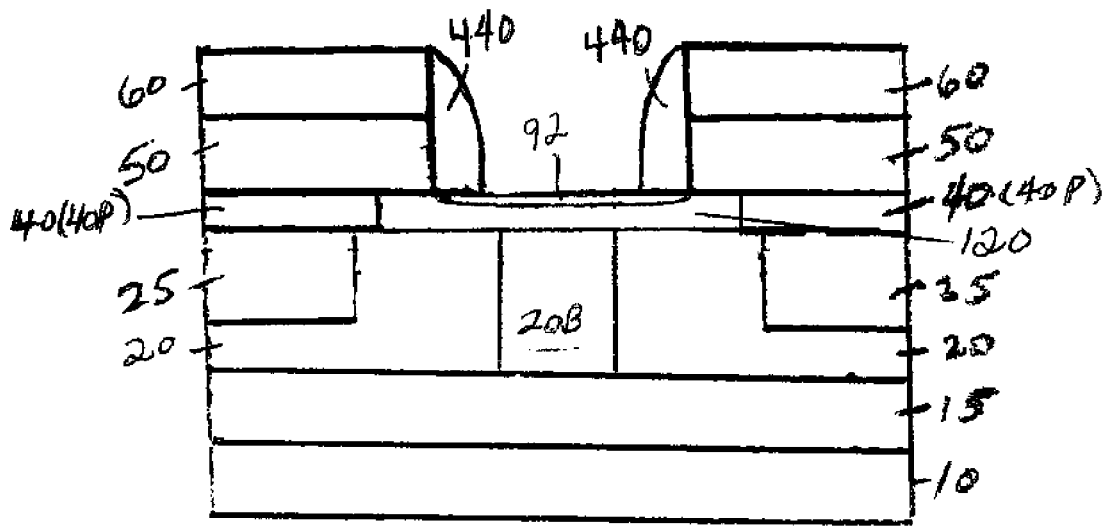
FIG. 21 shows the formation of oxide spacers in accordance with an embodiment of the invention.

Referring once again to the structure shown in FIG. 14, we now show an alternate embodiment of a process for further completing the structure (starting with the partially completed structure shown in FIG. 14). As an alternate embodiment, from the structure shown in FIG. 14, one may proceed to FIG. 21. FIG. 21 shows the formation of oxide spacers 440 on the sidewalls of the polysilicon layer 50 and the oxide layer 60. The oxide spacers 440 may be formed by the conformal deposition of an oxide layer followed by the anisotropic etch of this oxide layer.

Figure 22:
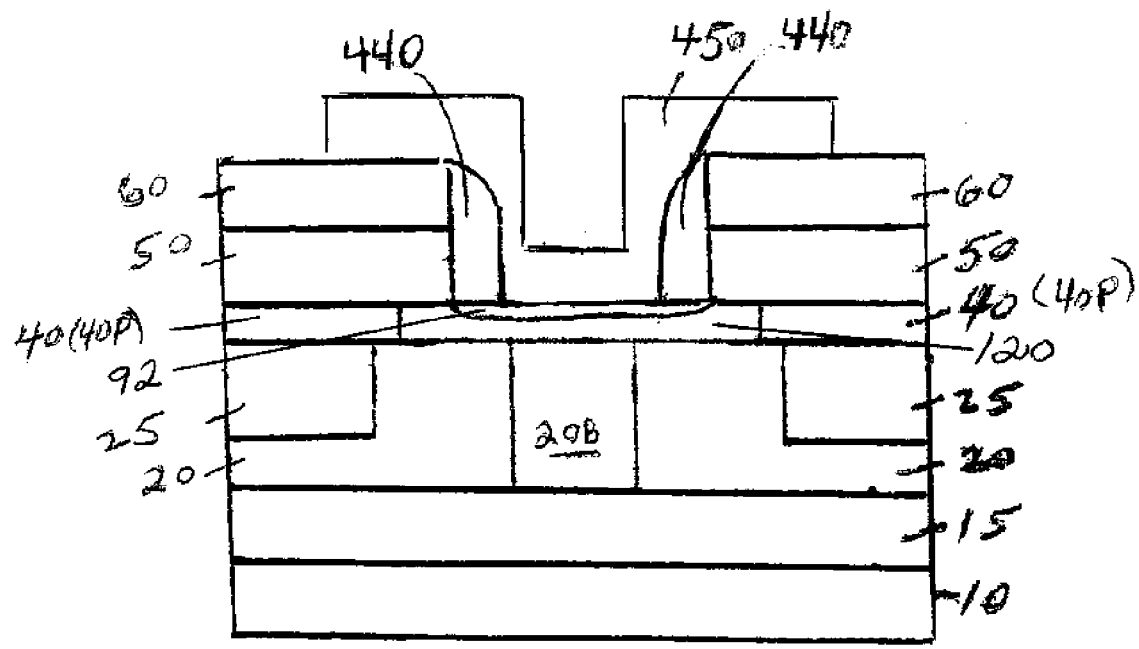
FIG. 22 shows the formation of an emitter layer in accordance with an embodiment of the invention.

Referring to FIG. 22, the formation of the oxide spacers 440 is followed by the formation of the emitter layer 450. The emitter layer 450 may be formed as a heavily n+ doped layer. The emitter layer 450 may be formed from a heavily arsenic-doped material. The emitter layer 450 may be formed so as to grow monocrystalline on the silicon cap layer 92 and amorphous on the surrounding oxide layers 440 and 60. After patterning the emitter layer 450, a rapid thermal annealing (RTA) step may be performed, which diffuses the emitter layer a certain distance (for example, about 15 nm to about 30 nm) deep into the underlying silicon cap layer 92 of the base. During the emitter drive-in, the amorphous parts of the emitter layer 450 may become polycrystalline. After the emitter drive-in, processing continues by salicidation of the one or more base electrodes and by forming the copper metallization (not shown).

The process shown in FIGS. 1 through 20 as well as the process shown in FIGS. 1 through 14, 21 and 22, each provide an example of a process for forming an embodiment of a heterojunction bipolar transistor. A heterojunction bipolar transistor may also be referred to as a heterobipolar transistor or an HBT. The heterojunction transistor may be a SiGe heterojunction transistor comprising a SiGe base layer. In one or more embodiments, the SiGe base layer may be formed from any SiGe material. In one or more embodiments, the SiGe material may have the atomic composition $Si_{1-x}Ge_x$ where X is greater than 0 and less than 1. In one or more embodiments, the SiGe base layer does not include C (the element carbon). In one or more embodiments, the SiGe base layer includes C (the element carbon).

In one or more embodiments, the base layer may be a SiGeC base layer. In one or more embodiments, the base layer may be a SiC base layer. In one or more embodiments, the base layer may comprise Si (the element silicon) and Ge (the element germanium). In one or more embodiments, the base layer may comprise C (the element carbon). In one or more embodiments, the base layer may comprise Si, Ge and C (the elements silicon, germanium and carbon). In one or more embodiments, the base layer may comprise an alloy of two or more elements. In one or more embodiments, the base layer may comprise a binary alloy or compound. In one or more embodiments, the base layer may comprise a tertiary alloy or compound. In one or more embodiments, the base layer may be doped with a p-type dopant (such as boron). In one or more embodiments, the base layer may be p+ type doped. In one or more embodiments, the base layer may comprise a composite material (for example, the base layer may comprise two or more sublayers). In one or more embodiments, the base layer may comprise a graded material (for example, the graded material may have a graded composition).

In one or more embodiments, the p+ polysilicon layer 50 may be replaced with a different material such as a different conductive material. Likewise, the oxide layer 60, the nitride layer 70, the nitride layer 80 and the polysilicon layer 90 are not limited to these materials. One or more of these layers may replaced with other materials such as materials having the proper selectivity with respect to one another. Likewise, in one or more embodiments of the invention, it is possible that the oxide layer 40 be replaced with a different dielectric material. Likewise, in one or more embodiments, oxide layer 310 and nitride layer 320 may be replaced with other materials such as other dielectric materials. Likewise, in one or more embodiments, oxide spacers 440 may be replaced with spacers of another material such as another dielectric material.

In addition, the embodiment explained above has been for n-p-n transistors. In one or embodiments, it is possible to apply the same concepts to a p-n-p transistor.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method of making a heterojunction bipolar transistor (HBT) structure, comprising:
    forming a partially completed heterojunction bipolar transistor (HBT) structure, said partially completed heterojunction bipolar transistor (HBT) structure including a silicon layer having an exposed surface and a nitride layer having an exposed surface;
    growing a first oxide on the exposed surface of said silicon layer using an oxidation process; and
    after growing said first oxide, etching said nitride layer using an etchant.

2. The method of making a heterojunction bipolar transistor (HBT) structure according to claim 1, wherein said oxidation process comprises a dry oxidation.

3. The method of making a heterojunction bipolar transistor (HBT) structure according to claim 1, wherein said etchant comprises phosphoric acid.

4. The method of making a heterojunction bipolar transistor (HBT) structure according to claim 1, wherein said method further comprises the step of growing a second oxide on said nitride layer by said oxidation process before etching said nitride layer.

5. The method of making a heterojunction bipolar transistor (HBT) structure according to claim 1, wherein said oxidation process comprises a wet oxidation.

6. The method of making a heterojunction bipolar transistor (HBT) structure according to claim 1, wherein said oxidation process comprises a thermal oxidation.

7. The method of making a heterojunction bipolar transistor (HBT) structure according to claim 1, wherein said oxidation process comprises application of an oxygen plasma.

8. The method of making a heterojunction bipolar transistor (HBT) structure according to claim 1, wherein said etching comprises wet etching.

9. The method of making a heterojunction bipolar transistor (HBT) structure according to claim 1, wherein said etchant removes substantially all of said nitride layer and substantially none of said silicon layer.

10. The method of making a heterojunction bipolar transistor (HBT) structure according to claim 4, wherein said etchant etches through said second oxide and reaches said nitride layer before reaching said silicon layer.

11. A method of making a heterojunction bipolar transistor (HBT) structure, comprising:
    forming a partially completed heterojunction bipolar transistor structure, said partially completed heterojunction bipolar transistor (HBT) structure including an exposed silicon layer and an exposed nitride layer;
    growing a first oxide on said exposed silicon layer and a second oxide on said exposed nitride layer; and
    applying an etchant to said first oxide and said second oxide.

12. The method of making a heterojunction bipolar transistor (HBT) structure according to claim 11, wherein said first oxide and second oxide are formed by a dry oxidation process.

13. The method of making a heterojunction bipolar transistor (HBT) structure according to claim 11, wherein said first oxide and said second oxide are formed by plasma oxidation process.

14. The method of making a heterojunction bipolar transistor (HBT) structure according to claim 11, wherein said etchant is phosphoric acid.

15. The method of making a heterojunction bipolar transistor (HBT) structure according to claim 11, wherein said first oxide is thicker than said second oxide, said etchant etching through said second oxide and reaching said nitride layer before reaching said silicon layer.

16. The method of making a heterojunction bipolar transistor (HBT) structure according to claim 11, wherein said silicon layer is a silicon cap layer of said heterojunction transistor.

17. The method of making a heterojunction bipolar transistor (HBT) structure according to claim 11, wherein said etchant is a wet etchant.

18. The method of making a heterojunction bipolar transistor (HBT) structure according to claim 11, wherein said first oxide and said second oxide are formed by a wet oxidation process.

19. The method of making a heterojunction bipolar transistor (HBT) structure according to claim 11, wherein said etchant removes substantially all of said nitride layer and substantially none of said silicon layer.

* * * * *